(12) United States Patent
Nishioka et al.

(10) Patent No.: US 6,555,257 B1
(45) Date of Patent: *Apr. 29, 2003

(54) CORROSION-RESISTANT MEMBER, METHOD OF MANUFACTURING THE SAME AND APPARATUS FOR HEATING CORROSIVE SUBSTANCE

(75) Inventors: Masao Nishioka, Tokoname; Naotaka Katoh, Owariasahi; Shinji Kawasaki, Nagoya, all of (JP)

(73) Assignee: NGK Insulators, Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,804

(22) Filed: Oct. 23, 1998

(30) Foreign Application Priority Data

Oct. 27, 1997 (JP) .................................................. 9-309483
Oct. 6, 1998 (JP) ................................................. 10-297599

(51) Int. Cl.⁷ .............................. B32B 9/00; C23C 16/32
(52) U.S. Cl. ........................ 428/698; 428/212; 428/446; 427/249.15; 427/255.28; 427/255.39
(58) Field of Search .................................... 428/698, 446, 428/338, 212, 408; 427/249.1, 249.15, 255.23, 255.28

(56) References Cited

U.S. PATENT DOCUMENTS

| | | | |
|---|---|---|---|
| 4,755,483 | * | 7/1988 | Haku et al. .......................... 437/100 |
| 5,229,193 | * | 7/1993 | Madono et al. ...................... 428/212 |
| 5,882,807 | * | 3/1999 | Funato et al. ........................ 428/698 |
| 5,937,316 | * | 8/1999 | Inaba et al. .......................... 438/488 |

FOREIGN PATENT DOCUMENTS

| | | |
|---|---|---|
| 430905 | 8/1967 | (CH) . |
| 3704930 | 4/1988 | (DE) . |
| 0427294 | 5/1991 | (EP) . |

* cited by examiner

Primary Examiner—Deborah Jones
Assistant Examiner—Stephen Stein
(74) Attorney, Agent, or Firm—Parkhurst & Wendell, L.L.P.

(57) ABSTRACT

This invention relates to a corrosion-resistant member comprising a ceramic substrate and a silicon carbide film formed through a chemical vapor deposition process and having a resistivity at room temperature of 20–500 Ω·cm, and a method of manufacturing the same as well as an heating apparatus using the same.

8 Claims, 8 Drawing Sheets

FIG_1a
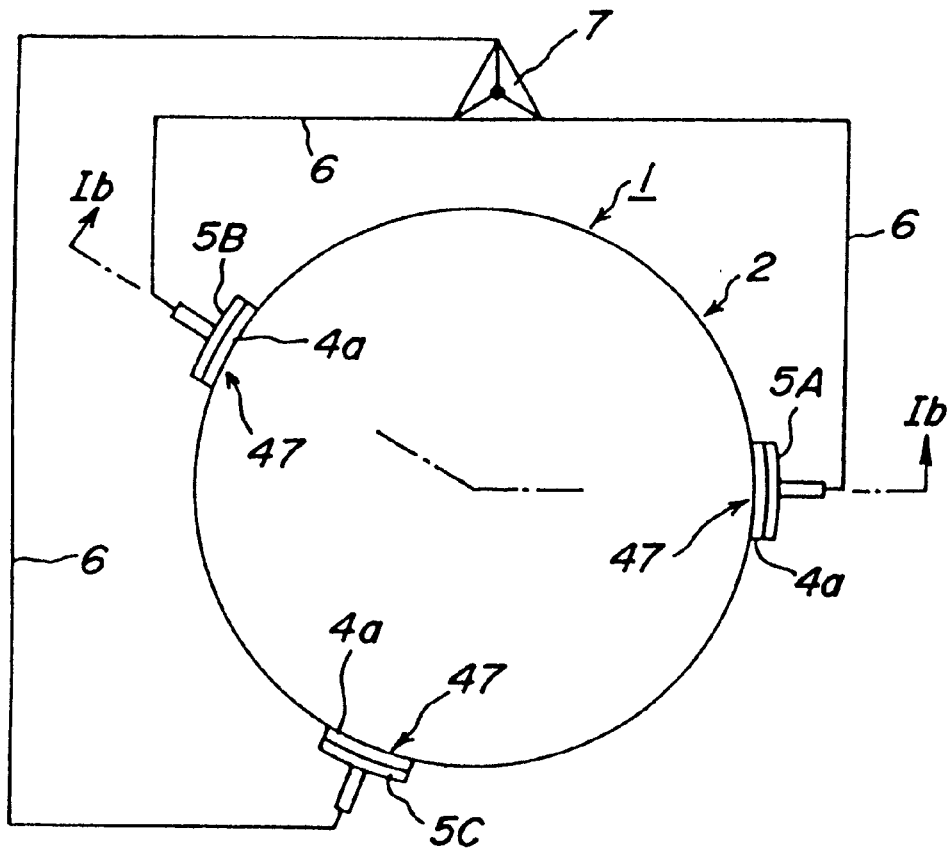
FIG_1b
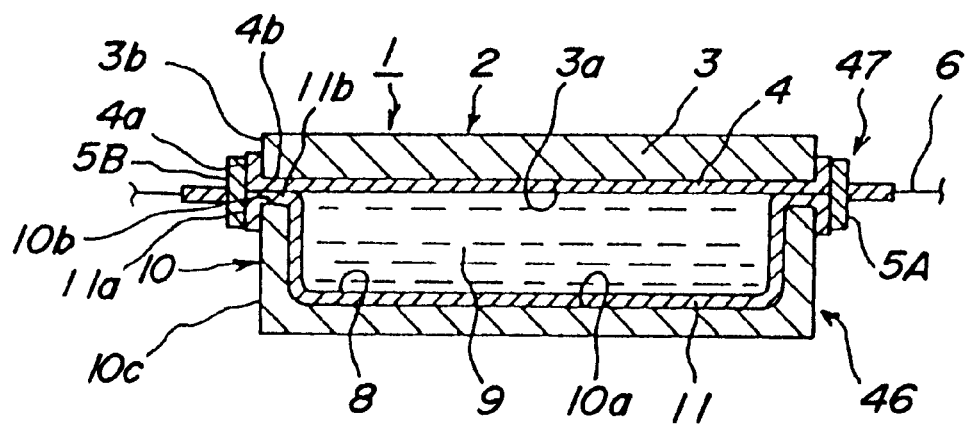

FIG_2
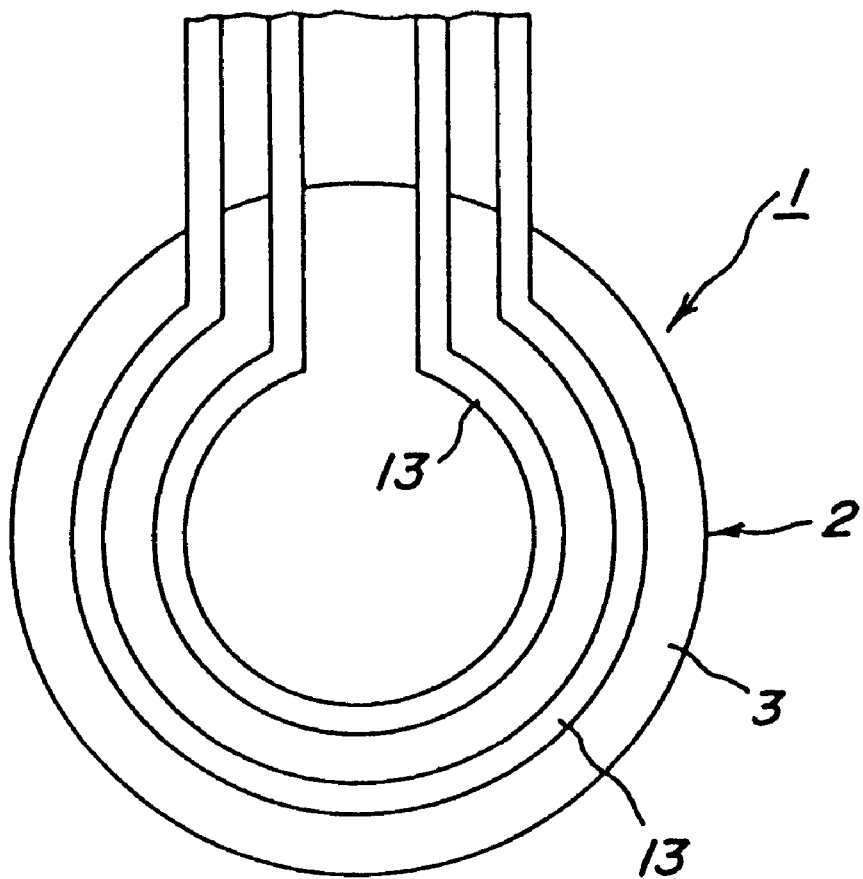

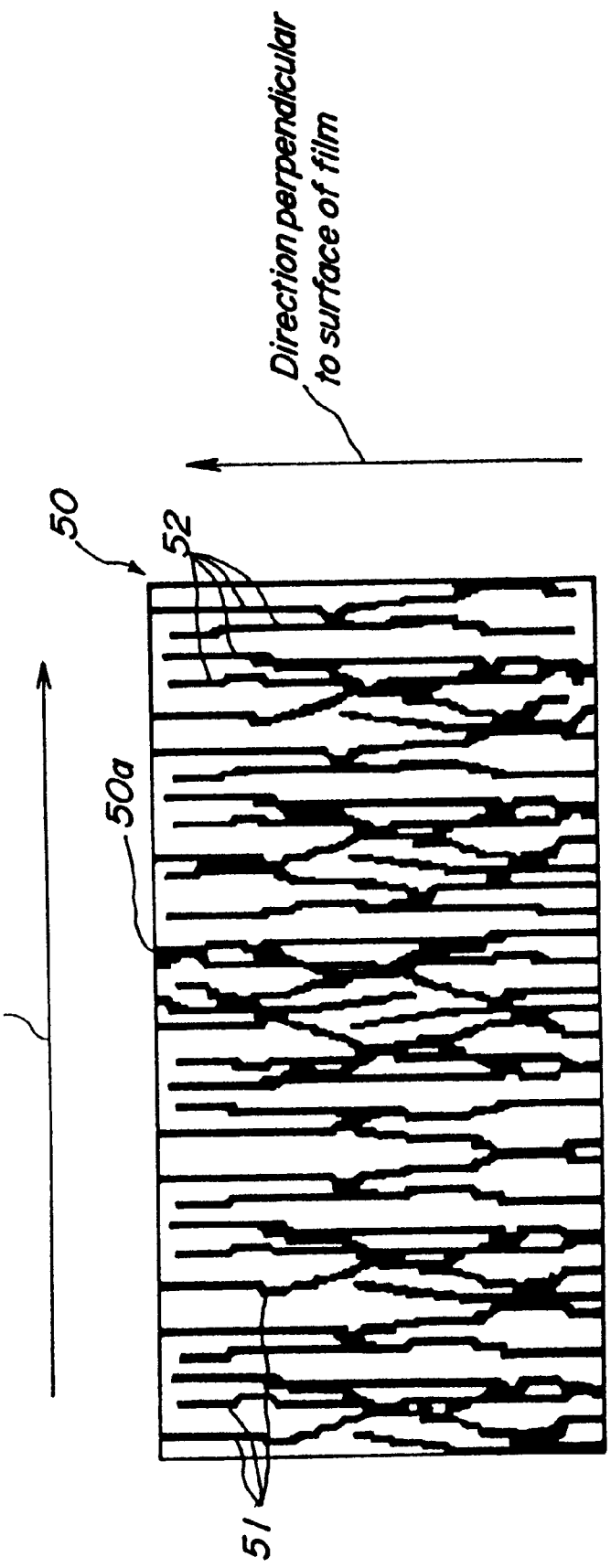
FIG_10

CORROSION-RESISTANT MEMBER, METHOD OF MANUFACTURING THE SAME AND APPARATUS FOR HEATING CORROSIVE SUBSTANCE

BACKGROUND OF THE INVENTION

1. Field of the Invention

This invention relates to a heating apparatus causing no pollution of solution or gas in the heating of a high purity solution such as an ultra pure water, a sterilized water or the like; a solution containing a strong acid ion such as aqua regia; a reactive and high a corrosive gas such as $CF_4$, $NF_3$, $ClF_3$, HF or the like; and so forth as well as a high purity corrosion-resistant member applied thereto.

2. Description of Related Art

In case of heating the solution such as the ultra pure water, the sterilized water or the like, a heater coated with a polytetrafluoro-ethylene (Teflon, trade name) is used for preventing the pollution of such a solution. Concretely, there is known a method wherein the heater is formed by coating a surface of a rod-shaped metal heating element with Teflon and placed in a container including the solution; or a method wherein an inner wall face of the container is coated with Teflon and heated from an exterior. At recent, it is demanded to heat a ultra-high purity corrosive solution containing hydrofluoric acid, nitric acid, hydrochloric acid or a mixed acid such as aqua regia in addition to the ultra pure water or the sterilized water without causing pollution through a metal ion or an organic matter.

In the latter case, Teflon is modified by the acid ion and hence Teflon is swollen to peel from the metal heating element or the container, or molecules in the solution permeate through Teflon. As a result, a metal ion from the metal heating element or the container pollutes the solution to be treated, or Teflon itself elutes therefrom, so that the apparatus can not be used for a long time.

In order to solve this problem, if the thickness of the Teflon coating is made thicker, since the thermal conductivity of Teflon is low, the heating efficiency becomes extremely low. And also, the heating can not be conducted at a higher temperature because the heat-resisting temperature of Teflon is about 300° C. Further, if a high inner pressure is applied to the container, the strength of the container coated with Teflon itself is required to be high and hence the thickness of the container becomes thicker. In this case, if the heating portion is arranged outside the container, it is impossible to rapidly heat the corrosive solution therein.

SUMMARY OF THE INVENTION

It is, therefore, an object of the invention to provide a heating apparatus for receiving and heating a corrosive substance, which is high in the corrosion resistance to the corrosive substance and good in the heat efficiency in the heating of the corrosive substance and can rapidly heat the corrosive substance without polluting the corrosive substance.

It is another object of the invention to provide a corrosion-resistant member usable for the above heating apparatus and a method of manufacturing the same.

According to a first aspect of the invention, there is the provision of a corrosion-resistant member comprising: a substrate of a ceramic having a resistivity at room temperature of not less than 5000 Ω·cm, and a silicon carbide film formed through a chemical vapor deposition process and covering at least a surface of the substrate exposed to a corrosive substance and having a resistivity at room temperature of 20–500 Ω·cm.

According to a second aspect of the invention, there is the provision of a method of manufacturing a corrosion-resistant member by forming a silicon carbide film on a substrate through a chemical vapor deposition method, in which hydrogen is fed at a film-forming temperature, and then at least one silicon-supplying compound selected from the group consisting of $SiCl_4$, $SiHCl_3$, $SiH_2Cl_2$ and $SiH_4$ and at least one carbon-supplying compound selected from the group consisting of $CH_4$, $C_2H_6$ and $C_3H_8$ are fed.

According to a third aspect of the invention, there is the provision of a method of manufacturing a corrosion-resistant member by forming a silicon carbide film on a substrate through a chemical vapor deposition method, in which when a mixed gas of at least one silicon-supplying compound selected from the group consisting of $SiCl_4$, $SiHCl_3$, $SiCl_2H_2$ and $SiH_4$, at least one carbon-supplying compound selected from the group consisting of $CH_4$, $C_2H_6$ and $C_3H_8$, $H_2$ and Ar is used as a starting gas, the following relations are satisfied in the starting gas:

$$0.14 \leq ([A]+[B] \times n)/([Ar]+[H_2]) \leq 0.55$$

$$1.0 \leq [A]/([B] \times n) \leq 1.6$$

$$0.09 \leq [Ar]/[H_2] \leq 5$$

wherein n is a carbon atom number per one molecule of the carbon-supplying compound, [A] is a volume of the silicon-supplying compound converted to gas at a standard state, [B] is a volume of the carbon-supplying compound converted to gas at a standard state, [Ar] is a volume of the argon converted to gas at a standard state, and $[H_2]$ is a volume of the hydrogen converted to gas at a standard state.

BRIEF DESCRIPTION OF THE DRAWINGS

The invention will be described with reference to the accompanying drawings, wherein:

FIG. 1(a) is a diagrammatic view of a preferable embodiment of the heating apparatus according to the invention;

FIG. 1(b) is a sectional view taken along a line Ib—Ib of FIG. 1(a);

FIG. 2 is a diagrammatic view of another preferable embodiment of the heating apparatus according to the invention;

FIG. 10 is a diagrammatic view showing a microstructure at section of a silicon carbide film according to the invention.

DESCRIPTION OF THE PREFERRED EMBODIMENTS

Figure 3:
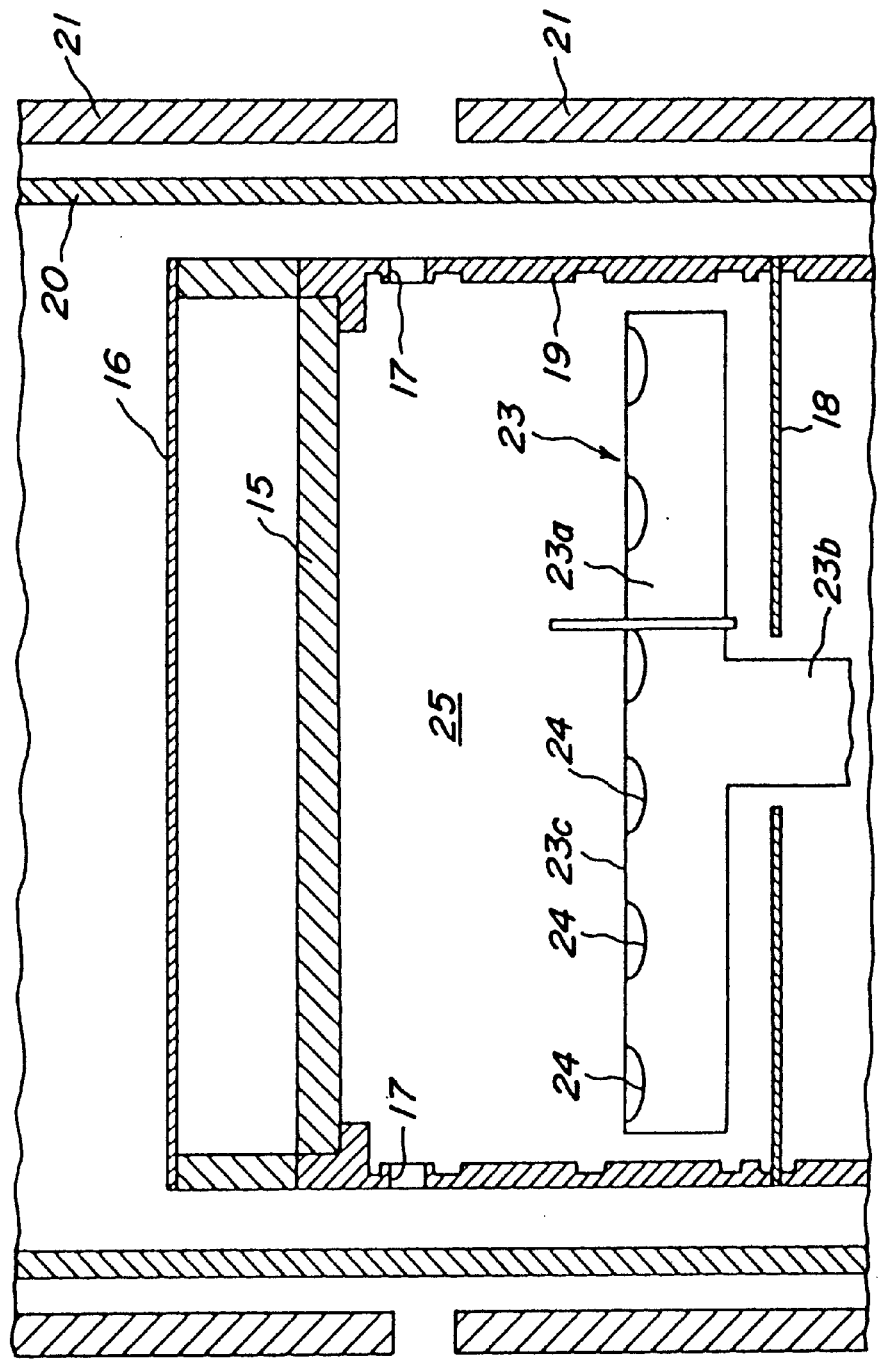
FIG. 3 is a diagrammatic view of a chemical vapor deposition apparatus suitable for manufacturing a corrosion-resistant member in the method according to the invention.

In FIG. 1(a) is diagrammatically shown an embodiment of the heating apparatus according to the invention, and FIG. 1(b) is a diagrammatically sectional view of the heating apparatus shown in FIG. 1(a). FIG. 2 is a diagrammatic view of another embodiment of the heating apparatus according to the invention.

In this heating apparatus, a container 1 is provided with a lower container body 46 and a lid 2 of, for example, a disc shape. A substrate 3 constituting the lid 2 is covered at its inner surface 3a and a part of its side surface 3b with a silicon carbide film 4. Further, a silicon carbide film 11 is formed on an inner surface 10a, an upper edge surface 10b and a part of an outer side surface 10c of a substrate 10 constituting the lower container body 46. A corrosive substance 9 is accommodated in an inner space 8 of the container 1. The silicon carbide films are provided on the whole surfaces of the substrates contacting with the corrosive substance, so that the corrosive substance does not contact with the substrates themselves. A diameter of the container 1 is not particularly limited, but may be, for instance, 300 mm or 500 mm, and a depth of the lower container body 46 may be, for instance, 100 mm.

The silicon carbide films 4b and 11b are contacted and rubbed with each other in a joint portion between the lid 2 and the lower container body 46, and hence an airtightness is held at this joint portion. The lid 2 and the lower container body 46 are pushed with each other from exterior by means of clamps to form an airtight container 1. In the lower container body 46, the silicon carbide film 11a is formed up to a part of the outer side surface 10c of the substrate 10, while the silicon carbide film 4a is formed on a part of the side surface 3b of the substrate 3 constituting the lid 2 and hence a connecting portions 47 is defined by these silicon carbide films 11a and 4a.

As shown in FIG. 1(a), the connecting portions 47 are arranged in given places of the container 1, for examples, three places. Metal electrodes 5A, 5B, 5C are joined to the respective connecting portions 47 so as to supply a three-phase alternating current to the silicon carbide films 4 and 11, whereby the corrosive substance 9 is heated. A reference 7 is a three-phase alternating power source.

As shown in FIG. 2, induction heating coils 13 are arranged at an outside of the container 1. In this case, the silicon carbide films 4 and 11 can be induction-heated by oscillating the induction heating coils 13.

In the silicon carbide film covering the surface of the substrate, a resistivity at room temperature is controlled to a range of 20–500 Ω·cm and the resistivity distribution is uniform in a surface direction of the silicon carbide film. The purity of the silicon carbide film is preferably not less than 99.9999%. The thickness of the substrate 3 is preferably not less than 8 mm, and the resistivity at room temperature thereof is not less than 5,000 Ω·cm, but is practically not more than 10,000 kΩ·cm.

The substrate is preferably a sintered body consisting essentially of silicon carbide. Such a sintered body includes the followings;
(1) a sintered body containing not less than 90% of silicon carbide and having a relative density of not less than 90%,
(2) a porous sintered body containing not less than 90% of silicon carbide and having a relative density of 56–90%,
(3) a mixed sintered body of silicon carbide and metallic silicon.

Alternatively, the material of the substrate may be an insulating ceramic such as silicon nitride, aluminum nitride or the like.

The silicon carbide film is preferably a perfectly dense body having a high purity and a density equal to a theoretical density and is hardly corroded by various solutions. In the invention, the whole surface of the substrate contacting with the solution is covered with the high purity and dense silicon carbide film, so that the substrate containing a great amount of impurities never contacts with the solution. Therefore, the solution to be heated is almost never polluted. Thus, the pollution degree in the solution can be controlled to not more than a level of ppt which is required in an ultra pure water. And also, since the corrosion of the silicon carbide film is very slow, good properties can be maintained over a long time of period. Further, since the surface of the silicon carbide film contacting with the corrosive substance directly generates heat, an efficiency of heating the corrosive substance is high.

Particularly, since the resistivity of the silicon carbide film contacting with the corrosive substance is controlled to 20–500 Ω·cm at room temperature, it is possible to supply a voltage to the electrodes and the silicon carbide film in the container. As a result, a particular devise is not necessary to the power source, and a heat value suitable as a heater can be secured. When the resistivity of the silicon carbide film is less than 20 Ω·cm, an excessive current should be flowed to the electrode and hence the power source becomes large and a special part such as thyristor or the like is required. While, when the resistivity of the silicon carbide film exceeds 500 Ω·cm, a current is too small and the function as a heater can not be developed.

Even if the corrosive substance is heated by induction heating, when the resistivity is less than 20 Ω·cm, there may be caused the breakage of the substrate due to thermal shock based on violent heat generation, while when the resistivity exceeds 500 Ω·cm, the amount of heat generation is too small and the heating can not be conducted.

In the invention, since heat is generated on the surface having a uniformly controlled resistivity, it is possible to conduct uniform heating and the heating efficiency is high. However, if the resistivity distribution of the silicon carbide film is ununiform, a current concentrates in a portion having a lower resistivity and hence a contact area between the heat generating portion and the liquid or gas relatively decreases and the heating efficiency becomes poor.

As the corrosive substance, the above mentioned corrosive solution is suitable. In case of, for example, semiconductor manufacturing purpose, there are demanded airtight parts exposed to a reactive plasma gas. As such a reactive plasma gas, $CF_4$, $NF_3$, $ClF_3$, HF, HCl, HBr, etc. are mentioned, which have a strong corrosiveness. Therefore, it is demanded to develop an article for heating the highly corrosive gas in the airtight container, to which are applicable the corrosion-resistant member and the heating apparatus according to the invention.

The above container is made of the corrosion-resistant member according to the invention. A method of manufacturing the corrosion-resistant member is exemplified below.

A given substrate 15 is placed in a furnace for chemical vapor deposition (CVD) diagrammatically shown in FIG. 3. The substrate 15 is supported by a retainer jig 19. Moreover, references 16 and 18 are jigs, respectively. In the illustrated embodiment, a starting material supply member 23 having T shape in a front view is arranged. The starting material supply member 23 comprises a base portion 23b and a blow-off portion 23a extending in a lateral direction. A given number of gas jetting ports 24 are formed on a surface 23c of the blow-off portion 23a facing the substrate. A reference 20 is an inner cylinder in the furnace and a reference 21 an outer heater.

A distance between the surface 23c of the starting material supply member 23 and the substrate 15 is set to, for example, 100–300 mm. A gas is jetted out from the gas jetting ports 24 while rotating the starting material supply member 23. The starting gas for CVD is jetted out from the gas jetting ports 24, flows in a space 25, impinges to the surface of the substrate 15, flows along the surface of the substrate 15, and then is discharged through gas discharge ports 17 formed in the retainer jig 19.

By using this type of the starting material supply member 23 and jetting out the gas therefrom while rotating the member 23, the thickness of the silicon carbide film covering the whole surface of the substrate 15 can be made uniform and also the resistivity thereof can be uniformized.

Preferably, each gas shown in Table 1 as the starting gas is flowed into the CVD furnace at a flow rate shown in Table 1, and heated under given pressure and temperature conditions. Particularly, after hydrogen is flowed into the furnace at a film-forming temperature for a predetermined period, silicon tetrachloride and methane are introduced into the furnace to form a silicon carbide film. By flowing hydrogen into the furnace at the film-forming temperature prior to the introduction of the starting gas, the adhesion property of the silicon carbide film to the substrate can be improved to prevent the peeling of the silicon carbide film. More desirably, the adhesion property between the substrate and the silicon carbide film can be further improved by introducing silicon tetrachloride into the furnace together with hydrogen and argon for a short period prior to the introduction of methane.

In the film-forming step, a CVD film having a resistivity at room temperature of 20–500 Ω·cm can be obtained by setting a ratio of silicon tetrachloride to methane and a ratio of silicon tetrachloride and methane as the raw material gas to argon and hydrogen as a carrier gas as shown in Table 1. In this case, numerical values shown in Table 1 are volume ratios converted to gas under a standard state. Moreover, a given thickness of the film is obtained by controlling a film-forming time. After the CVD process, the silicon carbide film can be ground to provide an article with a given size.

TABLE 1

| Step | Temperature-rising step | Film-forming step | Cooling step |
| --- | --- | --- | --- |
| Time (hour) | 1–15 | 3–30 | — |
| Temperature (° C.) | 1400–1500 | 1400–1500 | room temperature |
| Pressure (torr) | 150–300 | 150–300 | — |
| $(SiCl_4 + CH_4)/(Ar + H_2)$ | 0 | 0.18–0.55 | — |
| $SiCl_4/CH_4$ | — | 1–1.6 | — |
| $Ar/H_2$ | 0.1–5 | 0.1–5 | — |
| Total flow rate of gases (liter/min.) | 10–25 | 19–35 | — |

The inventors have further investigated in detail with respect to the microstructure of the silicon carbide film having a controlled resistivity by improving the chemical vapor deposition process as mentioned above and obtained the following knowledge.

Namely, the above obtained silicon carbide film is an aggregate of columnar crystals extending in a direction substantially perpendicular to or crossing to the surface of the film. A configuration of the columnar crystals is diagrammatically shown in FIG. 10. The silicon carbide film 50 is made from many columnar crystals 51. The columnar crystals 51 extend in a direction substantially perpendicular to the surface 50a of the silicon carbide film 50 as a whole.

And also, a grain boundary 52 of each columnar crystal 51 extends in a direction substantially perpendicular to the surface 50a of the silicon carbide film 50. That is, a (111) face of the columnar crystal 51 orients perpendicular to the surface of the film.

In the case, the feature that the columnar crystal 51 extends in a direction substantially perpendicular to the surface 50a of the silicon carbide film does not mean that all each columnar crystal 51 extends in a direction perpendicular to the surface 50a of the film, but means that when the silicon carbide film is measured by X-ray diffraction method, the strength in the (111) face of the columnar crystal 51 as measured from the surface 50a of the film is 10 times or more to the strength in the (111) face of the columnar crystal 51 as measured from the side perpendicular to the surface 50a of the film.

The inventors have measured resistivities in directions horizontal and perpendicular to the surface of the film with respect to several silicon carbide film specimens by two-terminal process. As a result, it has been found that the resistivity in the horizontal direction to the surface of the film is about $\frac{1}{5}$ to $\frac{1}{10}$ of the resistivity in the direction perpendicular thereto. This means that the current hardly flows in the longitudinal directions of the columnar crystal and the grain boundary, but easily flows in the direction perpendicular to the columnar crystal and the grain boundary. And also, it is considered that an electron easily flows in the direction perpendicular to the grain boundary 52. Therefore, it has been confirmed that the silicon carbide film having an adequate semiconducting property is obtained by properly controlling the configuration of the columnar crystal or grain boundary in the silicon carbide film.

Concretely, an aspect ratio of the columnar crystal is preferably within a range of 1.5–20, more particularly within a range of 1.8–15.

Further, the inventors observed a tip of the columnar crystal in the surface of the silicon carbide film after the chemical vapor deposition. As a result, it has been found that a facet of quadrilateral pyramid (a pyramid shape) appears in the tip of the columnar crystal. The facet of quadrilateral pyramid is considered to indicate a shape of a growing face in each columnar crystal. Therefore, it is considered that size distribution of a bottom face in the facet of quadrilateral pyramid may represents a size of the columnar crystal extending downward from the tip thereof. In this case, the term "size of the facet of quadrilateral pyramid" means a length from a corner of a quadrilateral to another corner diagonal thereto assuming that the bottom face of the facet is the quadrilateral when the facet is observed from a surface side of the film.

It has been found that when an average size of the facet is 4–6 $\mu$m viewing from the surface side of the silicon carbide film, the resistivity at room temperature of the silicon carbide film can be controlled to 20–500 Ω·cm by rendering 10–80% an area ratio of the facet having a size of not less than 20 $\mu$m to total area of the facets.

Further, the inventors have confirmed that the above silicon carbide film is a n-type semiconductor and found that the resistivity at room temperature of the silicon carbide film can be controlled to 20–500 Ω·cm when a Hall mobility at 20° C. is 0.3–1.5 cm$^2$/V·sec, a carrier density is $1 \times 10^{16}$–$1 \times 10^{18}$/cm$^3$, and an activation energy of carriers is 0.15–0.17 eV.

The reason why the silicon carbide film develops a property as n-type semiconductor is considered as follows. That is, it seems that distortion is caused in the crystal lattice of each columnar crystal in the vicinity of the grain boundary 52 of the columnar crystal 51 to produce holes. Even when the holes are generally produced by the distortion of the crystal lattice in the vicinity of the grain boundary, if electron is generated, the hole and the electron are offset with each other and hence the property as n-type semiconductor is not developed. For this reason, the feature that the crystal system according to the invention develops the property as n-type semiconductor can not be expected from the configuration of the crystal.

The invention will be described with respect to concrete experimental results below.

(Experiment 1)

A corrosion-resistant member is manufactured by using a CVD apparatus shown in FIG. 3 according to the above mentioned method. As a substrate 15 is used a disc-shaped substrate of silicon carbide ceramic of 400 mm in diameter and 30 mm in thickness. Each starting gas is introduced under each condition shown in Table 2 to form a silicon carbide film. In this case, the film-forming temperature is 1430° C.

During the temperature rising, argon as a carrier gas is fed. Next, flow rates of the gases are changed as shown in Table 2 during the film formation while maintaining the film-forming temperature at 1430° C. In Example 1, after 1430° is reached, hydrogen is previously introduced for 10 minutes and then silicon tetrachloride and methane are fed. In Example 2, after 1430° C. is reached, hydrogen is previously introduced for 10 minutes, and then hydrogen and silicon tetrachloride are fed for 1 minute, and thereafter silicon tetrachloride and methane are fed. In Comparative Example 1, after 1430° C. is reached, all gases are introduced at the same time. The thickness of the silicon carbide film is 1 mm at a central portion of the disc-shaped substrate.

Figure 4A:
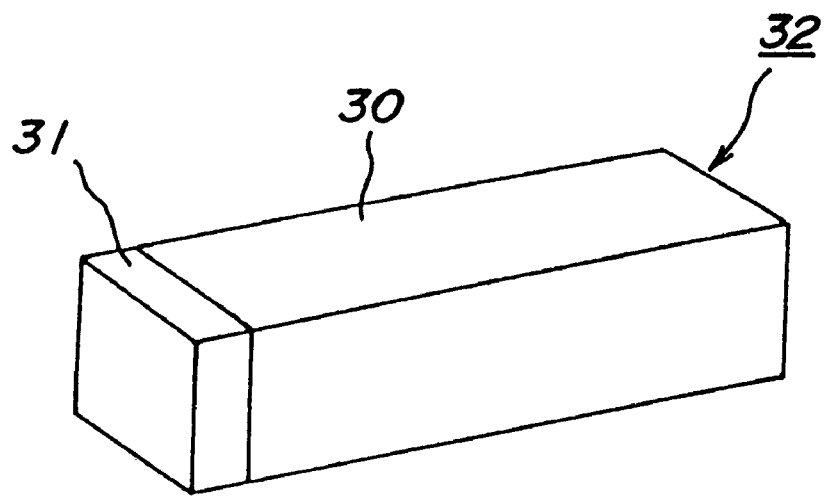
FIG. 4(a) is a perspective view illustrating a specimen 32 for the measurement of a bonding strength.
Figure 4B:
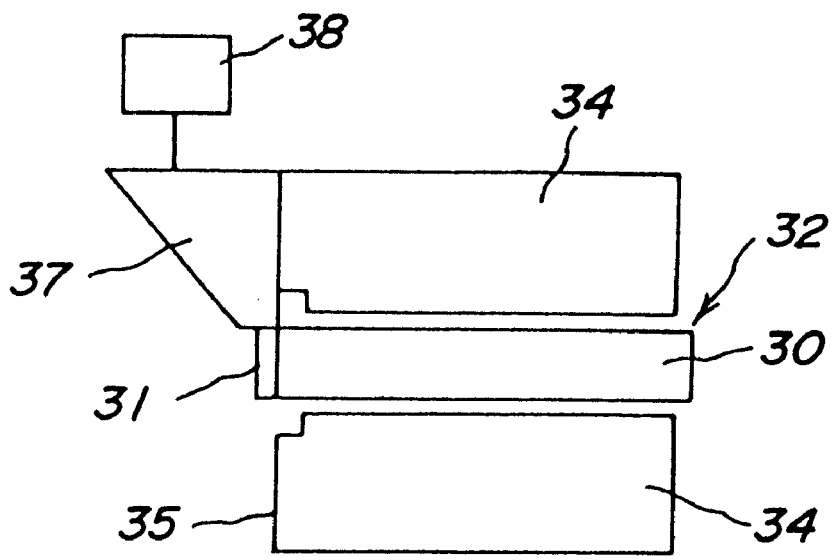
FIG. 4(b) is a diagrammatic view for explaining a method of measuring the bonding strength with the above specimen 32.

A rectangular parallelepiped specimen 32 as shown in FIG. 4(a) is cut out from each of the resulting products, wherein reference 30 is a substrate, and reference 31 a silicon carbide film. The specimen 32 has a size of 4 mm×3 mm×30 mm. A bonding strength of each silicon carbide film is measured by using a jig as shown in FIG. 4(b). In this case, the specimen 32 is supported by a die 34 so as to locate an interface between the silicon carbide film 31 and the substrate 30 at the same level as a surface 35 of the die 34. Then, a blade 37 is pushed against a 4 mm side of the silicon carbide film along the surface 35 to measure a load in the peeling of the silicon carbide film or a load in the breakage of the substrate itself. Reference 38 is a load cell.

The bonding strength is calculated according to the following equation:

Bonding strength=load at break/bonding area in which the bonded area is 12 mm$^2$.

Figure 5:
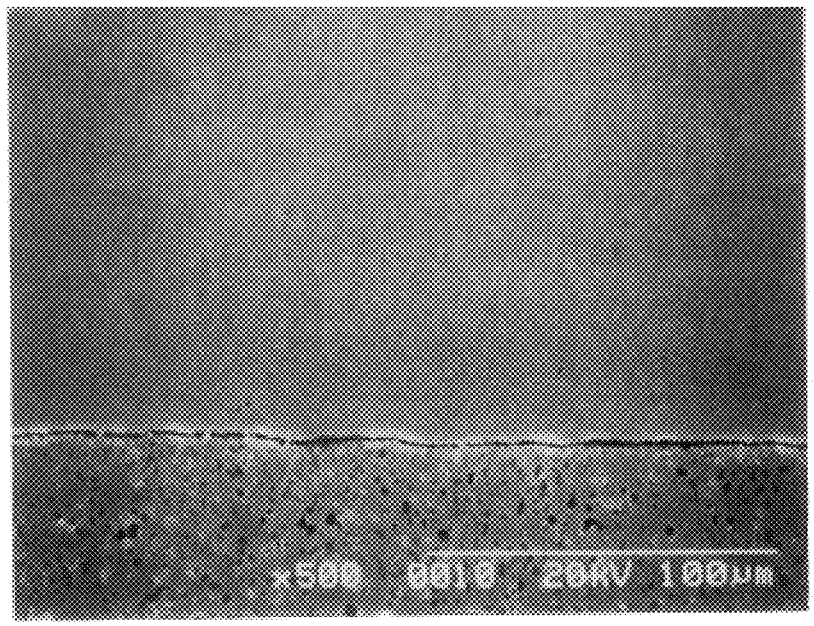
FIGS. 5 and 6 are electron microphotographs showing an interface state between a silicon carbide film and a substrate in Comparative Example 1 of Experiment 1, respectively.
Figure 6:
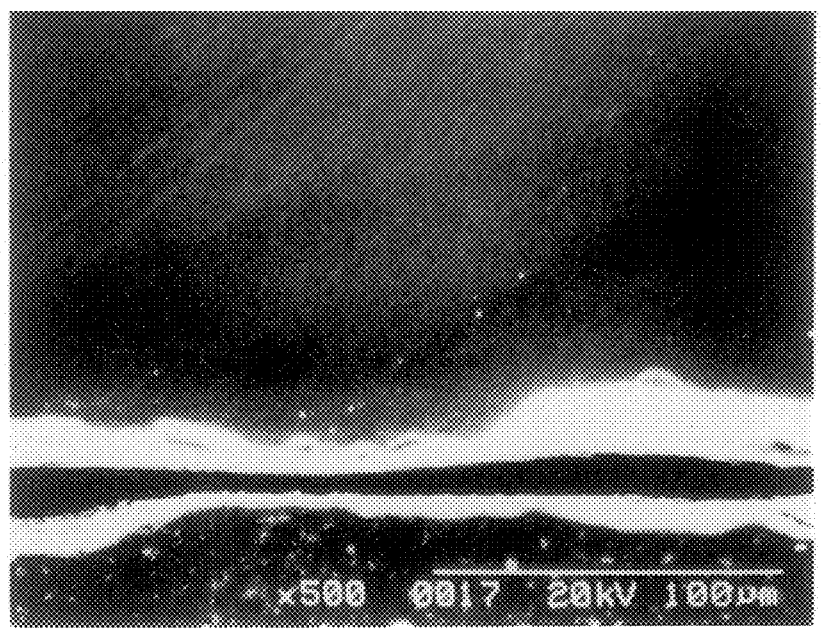

When silicon tetrachloride, methane and hydrogen are fed at the film-forming temperature as shown in Comparative Example 1, the peeling may be observed at the interface between silicon carbide film and the substrate as shown in FIGS. 5 and 6. In FIGS. 5 and 6, the lower portion is the substrate and the upper portion is the silicon carbide film. The peeling is more distinctly shown in FIG. 6.

Figure 7:
FIG. 7 is an electron microphotograph showing an interface state between a silicon carbide film and a substrate in Example 1 of Experiment 1.

When hydrogen is previously introduced at the film-forming temperature and then silicon tetrachloride and methane are fed as shown in Example 1, the bonding strength of the silicon carbide film to the substrate is largely improved and no peeling at the interface is caused as shown in FIG. 7. In FIG. 7, the lower portion is the substrate and the upper portion the silicon carbide film.

Figure 8:
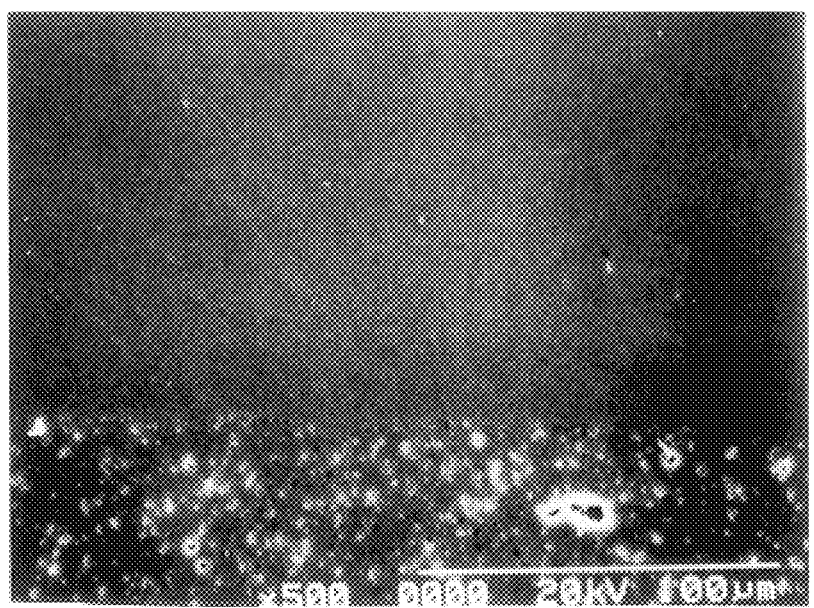
FIG. 8 is an electron microphotograph showing an interface state between a silicon carbide film and a substrate in Example 2 of Experiment 1.

When only silicon tetrachloride is fed for one minute prior to the introduction of methane as shown in Example 2, the bonding strength is further improved to become equal to the strength at break of the substrate itself. In this case, the interface between the film and the substrate is not clear as shown in FIG. 8, from which it is apparent that the film is highly adhered to the substrate. In FIG. 8, the lower portion is the substrate and the upper portion the silicon carbide film.

TABLE 2

| | | Introduction of starting gases | | | unit: liter/min | Bonding strength | Judgment |
|---|---|---|---|---|---|---|---|
| Comparative Example 1 | | during temperature-rising | during film-formation | | | <50 MPa | x |
| | Ar | 7.5 | 7.5 | | | | |
| | H$_2$ | | 17.5 | | | | |
| | SiCl$_4$ | | 5.2 | | | | |
| | CH$_4$ | | 4 | | | | |
| Example 1 | | during temperature-rising | 10 min | during film-formation | | >200 MPa | ○ |
| | Ar | 7.5 | 7.5 | 7.5 | | | |
| | H$_2$ | | 17.5 | 17.5 | | | |
| | SiCl$_4$ | | | 5.2 | | | |
| | CH$_4$ | | | 4 | | | |
| Example 2 | | during temperature-rising | 10 min | 1 min | during film-formation | >300 MPa | ⊙ |
| | Ar | 7.5 | 7.5 | 7.5 | 7.5 | | |
| | H$_2$ | | 17.5 | 17.5 | 17.5 | | |
| | SiCl$_4$ | | | 5.2 | 5.2 | | |
| | CH$_4$ | | | | 4 | | |

Note)
x: bad, ○: good, ⊙: excellent (Experiment 2)

The same procedure as in Experiment 1 is repeated except that the silicon-supplying compound is altered to SiHCl$_3$. The results are shown in Table 3.

TABLE 3

| | | Introduction of starting gases unit: liter/min | | | Bonding strength | Judgment |
|---|---|---|---|---|---|---|
| Comparative Example 2 | | during temperature-rising | during film-formation | | <50 MPa | × |
| | Ar | 7.5 | 7.5 | | | |
| | H$_2$ | | 17.5 | | | |
| | SiHCl$_3$ | | 5.2 | | | |
| | CH$_4$ | | 4 | | | |
| Example 3 | | during temperature-rising | 10 min | during film-formation | >190 MPa | ○ |
| | Ar | 7.5 | 7.5 | 7.5 | | |
| | H$_2$ | | 17.5 | 17.5 | | |
| | SiHCl$_3$ | | | 5.2 | | |
| | CH$_4$ | | | 4 | | |
| Example 4 | | during temperature-rising | 10 min | 1 min | during film-formation | >280 MPa | ◉ |
| | Ar | 7.5 | 7.5 | 7.5 | 7.5 | | |
| | H$_2$ | | 17.5 | 17.5 | 17.5 | | |
| | SiHCl$_3$ | | | 5.2 | 5.2 | | |
| | CH$_4$ | | | | 4 | | |

Note)
×: bad, ○: good, ◉: excellent

When SiHCl$_3$, methane and hydrogen are introduced at the film-forming temperature as shown in Comparative Example 2, the peeling is observed at the interface between the silicon carbide film and the substrate. On the other hand, when hydrogen is previously introduced at the film-forming temperature and then SiHCl$_3$ and methane are fed as shown in Example 3, the bonding strength of the silicon carbide film to the substrate is largely improved. When SiHCl$_3$ is fed for one minute prior to the introduction of methane as shown in Example 4, the bonding strength is further improved to become equal to the strength at break of the substrate itself.

(Experiment 3)

The same procedure as in Experiment 1 is repeated except that the silicon-supplying compound is altered to SiH$_2$Cl$_2$. The results are shown in Table 4.

TABLE 4

| | | Introduction of starting gases unit: liter/min | | | Bonding strength | Judgment |
|---|---|---|---|---|---|---|
| Comparative Example 3 | | during temperature-rising | during film-formation | | <30 MPa | × |
| | Ar | 7.5 | 7.5 | | | |
| | H$_2$ | | 17.5 | | | |
| | SiH$_2$Cl$_2$ | | 5.2 | | | |
| | CH$_4$ | | 4 | | | |
| Example 5 | | during temperature-rising | 10 min | during film-formation | >190 MPa | ○ |
| | Ar | 7.5 | 7.5 | 7.5 | | |
| | H$_2$ | | 17.5 | 17.5 | | |
| | SiH$_2$Cl$_2$ | | | 5.2 | | |
| | CH$_4$ | | | 4 | | |
| Example 6 | | during temperature-rising | 10 min | 1 min | during film-formation | >260 MPa | ◉ |
| | Ar | 7.5 | 7.5 | 7.5 | 7.5 | | |
| | H$_2$ | | 17.5 | 17.5 | 17.5 | | |
| | SiH$_2$Cl$_2$ | | | 5.2 | 5.2 | | |
| | CH$_4$ | | | | 4 | | |

Note)
×: bad, ○: good, ◉: excellent

When SiH$_2$Cl$_2$, methane and hydrogen are introduced at the film-forming temperature as shown in Comparative Example 3, the peeling is observed at the interface between the silicon carbide film and the substrate. On the other hand, when hydrogen is previously introduced at the film-forming temperature and then SiH$_2$Cl$_2$ and methane are fed as shown in Example 5, the bonding strength of the silicon carbide film to the substrate is largely improved. When SiH$_2$Cl$_2$ is fed for one minute prior to the introduction of methane as shown in Example 6, the bonding strength is further improved to become equal to the strength at break of the substrate itself.

(Experiment 4)

The same procedure as in Experiment 1 is repeated except that the silicon-supplying compound is altered to $SiH_4$. The results are shown in Table 5.

TABLE 5

| | | Introduction of starting gases unit: liter/min | | | Bonding strength | Judgment |
|---|---|---|---|---|---|---|
| Comparative Example 4 | | during temperature-rising | during film-formation | | <40 MPa | × |
| | Ar | 7.5 | 7.5 | | | |
| | $H_2$ | | 17.5 | | | |
| | $SiH_4$ | | 5.2 | | | |
| | $CH_4$ | | 4 | | | |
| Example 7 | | during temperature-rising | 10 min | during film-formation | >180 MPa | ○ |
| | Ar | 7.5 | 7.5 | 7.5 | | |
| | $H_2$ | | 17.5 | 17.5 | | |
| | $SiH_4$ | | | 5.2 | | |
| | $CH_4$ | | | 4 | | |
| Example 8 | | during temperature-rising | 10 min | 1 min | during film-formation | >250 MPa | ◎ |
| | Ar | 7.5 | 7.5 | 7.5 | 7.5 | | |
| | $H_2$ | | 17.5 | 17.5 | 17.5 | | |
| | $SiH_4$ | | | 5.2 | 5.2 | | |
| | $CH_4$ | | | | 4 | | |

Note)
×: bad, ○: good, ◎: excellent

As mentioned above, when hydrogen is first introduced at the film-forming temperature, a trace of oxygen bonded to the surface of the substrate can be removed to expose silicon metal atom on the surface of the substrate, to which the CVD film is bonded to improve the bonding strength. On the other hand, when silicon tetrachloride is fed prior to the introduction of methane, silicon atom produced by decomposition strongly bonds to the surface of the substrate, through which silicon is carbonized by effect of methane to form silicon carbide to thereby provide a higher bonding strength. Incidentally, if methane is previously fed prior to the silicon tetrachloride, a carbon layer is formed through thermal decomposition of methane, which brings about the peeling of the silicon carbide film.

(Experiment 5)

Figure 9:
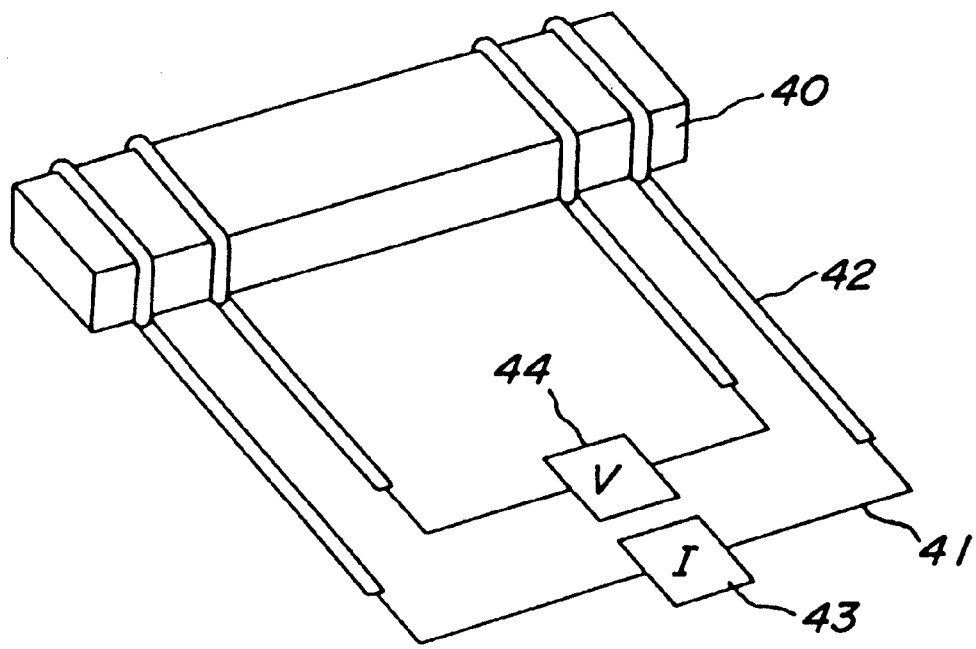
FIG. 9 is a diagrammatic view illustrating an apparatus for measuring a resistivity of a silicon carbide film.

A silicon carbide film is formed on a silicon carbide ceramic substrate having a diameter of 400 mm in the same manner as in Experiment 1 by using a CVD apparatus shown in FIG. 3. The film-forming temperature is 1430° C. The thickness of the silicon carbide film is 2 mm at a central portion of the disc-shaped substrate, and 1.6 mm at an end portion thereof. After the formation of the silicon carbide film, as shown in FIG. 9, only a portion of the silicon carbide film is cut out from the substrate at nine places to obtain nine rectangular parallelepiped specimens 40 each having a width of 4 mm and a length of 40 mm. Then, four platinum conductors 41 are wound around the specimen 40 in given places and connected to an ammeter 43 and an voltage indicator 44, respectively, and thereafter a resistivity is measured by a four-terminal process.

In order to ensure conduction between the specimen 40 and the conductor 41, a platinum paste 42 is applied to the surfaces of the specimen and the conductor. Among four conductors, a constant current is applied between the outer two conductors (current terminals), during which a voltage between the inner two conductors (voltage terminals) is measured. The measurement is performed in a chamber held at 20° C. The resistivity is calculated according to the following equation.

Resistivity=(width of specimen×thickness of specimen×voltage)/ (distance between voltage terminals×current)

In Tables 6–16, the resistivity is represented by minimum and maximum measured values.

Each silicon carbide film to be measured is formed by varying flow rates of the starting gases at the film-forming temperature as shown in Tables 6–16. In this case, hydrogen is first fed at 1430° C. for 10 minutes, and then a silicon-supplying compound is introduced for one minute, and thereafter the silicon-supplying compound and the carbon-supplying compound are introduced.

TABLE 6

| | Ar | $H_2$ | $SiCl_4$ | $CH_4$ | $(SiCl_4 + CH_4)/(Ar + H_2)$ | Resistivity $(\Omega \cdot cm)$ | Judgment |
|---|---|---|---|---|---|---|---|
| Comparative Example | 7.5 | 17.5 | 9.1 | 7.0 | 0.64 | 1~10 | × |

TABLE 6-continued

| | Ar | $H_2$ | $SiCl_4$ | $CH_4$ | $(SiCl_4 + CH_4)/(Ar + H_2)$ | Resistivity ($\Omega \cdot cm$) | Judgment |
|---|---|---|---|---|---|---|---|
| Acceptable Example | 7.6 | 17.5 | 7.8 | 6.0 | 0.55 | 26~40 | ○ |
| Acceptable Example | 7.6 | 17.5 | 6.5 | 5.0 | 0.46 | 36~90 | ○ |
| Acceptable Example | 7.6 | 17.5 | 5.2 | 4.0 | 0.37 | 50~100 | ○ |
| Acceptable Example | 7.6 | 17.5 | 3.9 | 3.0 | 0.27 | 90~250 | ○ |
| Acceptable Example | 7.6 | 17.5 | 2.6 | 2.0 | 0.18 | 120~380 | ○ |
| Comparative Example | 7.6 | 17.5 | 1.3 | 1.0 | 0.09 | 600~3200 | × |

Note)
×: bad, ○: good

In Table 6, each flow rate of $SiCl_4$ and $CH_4$ is varied.

TABLE 7

| | Ar | $H_2$ | $SiCl_4$ | $CH_4$ | $SiCl_4/CH_4$ | Resistivity ($\Omega \cdot cm$) | Judgment |
|---|---|---|---|---|---|---|---|
| Comparative Example | 7.6 | 17.5 | 3.5 | 4.0 | 0.875 | 0.05~0.3 | × |
| Acceptable Example | 7.6 | 17.5 | 4.0 | 4.0 | 1.0 | 23~58 | ○ |
| Acceptable Example | 7.6 | 17.5 | 5.2 | 4.0 | 1.3 | 50~100 | ○ |
| Acceptable Example | 7.6 | 17.5 | 6.0 | 4.0 | 1.5 | 60~120 | ○ |
| Acceptable Example | 7.6 | 17.5 | 6.4 | 4.0 | 1.6 | 65~130 | ○ |

TABLE 7-continued

| | Ar | $H_2$ | $SiCl_4$ | $CH_4$ | $SiCl_4/CH_4$ | Resistivity ($\Omega \cdot cm$) | Judgment |
|---|---|---|---|---|---|---|---|
| Comparative Example | 7.6 | 17.5 | 6.8 | 4.0 | 1.7 | 3~14 | × |

Note)
×: bad ○: good

TABLE 8

| | Ar | $H_2$ | $SiCl_4$ | $CH_4$ | $Ar/H_2$ | Resistivity ($\Omega \cdot cm$) | Judgment |
|---|---|---|---|---|---|---|---|
| Comparative Example | 25.0 | 0.1 | 5.2 | 4.0 | 250 | 0.002~0.1 | × |
| Acceptable Example | 20.1 | 5.0 | 5.2 | 4.0 | 4.02 | 23~60 | ○ |
| Acceptable Example | 7.6 | 17.5 | 5.2 | 4.0 | 0.43 | 50~100 | ○ |
| Acceptable Example | 2.0 | 23.1 | 5.2 | 4.0 | 0.09 | 30~66 | ○ |
| Comparative Example | 0 | 25.1 | 5.2 | 4.0 | 0 | 0.3~4.2 | × |

Note)
×: bad, ○: good

TABLE 9

| | Ar | $H_2$ | $SiH_2Cl_2$ | $CH_4$ | $(SiH_2Cl_2 + CH_4)/(Ar + H_2)$ | Resistivity ($\Omega \cdot cm$) | Judgment |
|---|---|---|---|---|---|---|---|
| Comparative Example | 7.6 | 17.5 | 9.1 | 7.0 | 0.64 | 1~13 | × |
| Acceptable Example | 7.6 | 17.5 | 7.8 | 6.0 | 0.55 | 30~100 | ○ |
| Acceptable Example | 7.6 | 17.5 | 6.5 | 5.0 | 0.46 | 50~120 | ○ |
| Acceptable Example | 7.6 | 17.5 | 5.2 | 4.0 | 0.37 | 60~120 | ○ |
| Acceptable Example | 7.6 | 17.5 | 3.9 | 3.0 | 0.27 | 80~290 | ○ |
| Acceptable Example | 7.6 | 17.6 | 2.6 | 2.0 | 0.18 | 120~350 | ○ |
| Comparative Example | 7.6 | 17.5 | 1.3 | 1.0 | 0.09 | 720~3600 | × |

Note)
×: bad, ○: good

In Table 9, each flow rate of $SiH_2Cl_2$ and $CH_4$ is varied.

TABLE 10

| | Ar | $H_2$ | $SiH_2Cl_2$ | $CH_4$ | $SiH_2Cl_2/CH_4$ | Resistivity ($\Omega \cdot cm$) | Judgment |
|---|---|---|---|---|---|---|---|
| Comparative Example | 7.6 | 17.5 | 3.5 | 4.0 | 0.875 | 0.03~0.5 | × |
| Acceptable Example | 7.6 | 17.5 | 4.0 | 4.0 | 1.0 | 60~150 | ○ |

TABLE 10-continued

| | Ar | $H_2$ | $SiH_2Cl_2$ | $CH_4$ | $SiH_2Cl_2/CH_4$ | Resistivity ($\Omega.cm$) | Judgment |
|---|---|---|---|---|---|---|---|
| Acceptable Example | 7.6 | 17.5 | 5.2 | 4.0 | 1.3 | 60~120 | ○ |
| Acceptable Example | 7.6 | 17.5 | 6.0 | 4.0 | 1.5 | 100~220 | ○ |
| Acceptable Example | 7.6 | 17.5 | 6.4 | 4.0 | 1.6 | 120~330 | ○ |
| Comparative Example | 7.6 | 17.5 | 6.8 | 4.0 | 1.7 | 0.2~2 | × |

Note)
×: bad, ○: good

TABLE 11

| | Ar | $H_2$ | $SiH_2Cl_2$ | $CH_4$ | $Ar/H_2$ | Resistivity ($\Omega.cm$) | Judgment |
|---|---|---|---|---|---|---|---|
| Comparative Example | 25.0 | 0.1 | 5.2 | 4.0 | 250 | 0.003~0.15 | × |
| Acceptable Example | 20.1 | 5.0 | 5.2 | 4.0 | 4.02 | 90~200 | ○ |
| Acceptable Example | 7.6 | 17.5 | 5.2 | 4.0 | 0.43 | 60~120 | ○ |
| Acceptable Example | 2.0 | 23.1 | 5.2 | 4.0 | 0.09 | 70~200 | ○ |
| Comparative Example | 0 | 25.1 | 5.2 | 4.0 | 0 | 1.8~7.3 | × |

Note)
×: bad, ○: good

TABLE 12

| | Ar | $H_2$ | $SiH_4$ | $CH_4$ | $(SiH_4 + CH_4)/(Ar + H_2)$ | Resistivity ($\Omega.cm$) | Judgment |
|---|---|---|---|---|---|---|---|
| Comparative Example | 7.6 | 17.5 | 9.1 | 7.0 | 0.64 | 0.2~2 | × |
| Acceptable Example | 7.6 | 17.5 | 7.8 | 6.0 | 0.55 | 70~100 | ○ |
| Acceptable Example | 7.6 | 17.5 | 6.5 | 5.0 | 0.46 | 90~180 | ○ |
| Acceptable Example | 7.6 | 17.5 | 5.2 | 4.0 | 0.37 | 120~200 | ○ |
| Acceptable Example | 7.6 | 17.5 | 3.9 | 3.0 | 0.27 | 160~260 | ○ |
| Acceptable Example | 7.6 | 17.5 | 2.6 | 2.0 | 0.18 | 190~300 | ○ |
| Comparative Example | 7.6 | 17.5 | 1.3 | 1.0 | 0.09 | 1200~3100 | × |

Note)
×: bad, ○: good

In Table 12, each flow rate of $SiH_4$ and $CH_4$ is varied.

TABLE 13

| | Ar | $H_2$ | $SiH_4$ | $CH_4$ | $SiH_4/CH_4$ | Resistivity ($\Omega.cm$) | Judgment |
|---|---|---|---|---|---|---|---|
| Comparative Example | 7.6 | 17.5 | 3.5 | 4.0 | 0.875 | 0.01~0.1 | × |
| Acceptable Example | 7.6 | 17.5 | 4.0 | 4.0 | 1.0 | 50~150 | ○ |
| Acceptable Example | 7.6 | 17.5 | 5.2 | 4.0 | 1.3 | 120~200 | ○ |
| Acceptable Example | 7.6 | 17.5 | 6.0 | 4.0 | 1.5 | 140~240 | ○ |
| Acceptable Example | 7.6 | 17.5 | 6.4 | 4.0 | 1.6 | 170~300 | ○ |
| Comparative Example | 7.6 | 17.5 | 6.8 | 4.0 | 1.7 | 1~4 | × |

Note)
×: bad, ○: good

TABLE 14

| | Ar | $H_2$ | $SiH_4$ | $CH_4$ | $Ar/H_2$ | Resistivity ($\Omega.cm$) | Judgment |
|---|---|---|---|---|---|---|---|
| Comparative Example | 25.0 | 0.1 | 5.2 | 4.0 | 250 | 0.002~0.08 | × |
| Acceptable Example | 20.1 | 5.0 | 5.2 | 4.0 | 4.02 | 90~200 | ○ |
| Acceptable Example | 7.6 | 17.5 | 5.2 | 4.0 | 0.43 | 120~200 | ○ |
| Acceptable Example | 2.0 | 23.1 | 5.2 | 4.0 | 0.09 | 80~190 | ○ |
| Comparative Example | 0 | 25.1 | 5.2 | 4.0 | 0 | 3.2~5.3 | × |

Note)
×: bad, ○: good

TABLE 15

| | Ar | $H_2$ | $SiH_4$ | $C_2H_6$ | $(SiH_4 + 2 C_2H_6)/(Ar + H_2)$ | Resistivity ($\Omega.cm$) | Judgment |
|---|---|---|---|---|---|---|---|
| Comparative Example | 7.6 | 17.5 | 9.1 | 3.5 | 0.64 | 2~15 | × |
| Acceptable Example | 7.6 | 17.5 | 7.8 | 3.0 | 0.55 | 60~90 | ○ |
| Acceptable Example | 7.6 | 17.5 | 6.5 | 2.5 | 0.46 | 80~180 | ○ |
| Acceptable Example | 7.6 | 17.5 | 5.2 | 2.0 | 0.37 | 100~180 | ○ |
| Acceptable Example | 7.6 | 17.5 | 3.9 | 1.5 | 0.27 | 150~230 | ○ |
| Acceptable Example | 7.6 | 17.5 | 2.6 | 1.0 | 0.18 | 180~290 | ○ |
| Comparative Example | 7.6 | 17.5 | 1.3 | 0.5 | 0.09 | 1100~3000 | × |

Note)
×: bad, ○: good

In Table 15, each flow rate of $SiH_4$ and $C_2H_6$ is varied.

TABLE 16

| | Ar | $H_2$ | $SiH_4$ | $C_2H_6$ | $(SiH_4 + 2 C_2H_6)/(Ar + H_2)$ | Resistivity ($\Omega.cm$) | Judgment |
|---|---|---|---|---|---|---|---|
| Comparative Example | 7.6 | 17.5 | 9.1 | 2.3 | 0.64 | 1~10 | × |
| Acceptable Example | 7.6 | 17.5 | 7.8 | 2.0 | 0.55 | 50~80 | ○ |
| Acceptable Example | 7.6 | 17.5 | 6.5 | 1.7 | 0.46 | 70~170 | ○ |
| Acceptable Example | 7.6 | 17.5 | 5.2 | 1.3 | 0.37 | 100~180 | ○ |
| Acceptable Example | 7.6 | 17.5 | 3.9 | 1.0 | 0.27 | 140~220 | ○ |
| Acceptable Example | 7.6 | 17.5 | 2.6 | 0.7 | 0.18 | 170~300 | ○ |

TABLE 16-continued

| | Ar | $H_2$ | $SiH_4$ | $C_2H_6$ | $(SiH_4 + 2 C_2H_6/ (Ar + H_2)$ | Resistivity ($\Omega$.cm) | Judgment |
|---|---|---|---|---|---|---|---|
| Comparative Example | 7.6 | 17.5 | 1.3 | 0.3 | 0.09 | 1600~3400 | x |

Note)
x: bad, ○: good

In Table 16, each flow rate of $SiH_4$ and $C_3H_8$ is varied.

As seen from the above results, when a mixed gas of at least one silicon-supplying gas (A) selected from the group consisting of $SiCl_4$, $SiHCl_3$, $SiH_2Cl_2$ and $SiH_4$, at least one carbon-supplying gas (B) selected from the group consisting of $CH_4$, $C_2H_6$ and $C_3H_8$, hydrogen and argon is used as a starting gas and the number of carbon atoms per molecule of the carbon-supplying gas (B) is n, it is possible to control the resistivity of the CVD-SiC film to 20–500 $\Omega$·cm by controlling volume ratios of these gases converted to gas at a standard state to the following ranges.

$$0.14 \leq ([A]+[B]\times n)/([Ar]+[H_2]) \leq 0.55$$

$$1.0 \leq [A]/([B]\times n) \leq 1.6$$

$$0.09 \leq [Ar]/[H_2] \leq 5$$

(Experiment 6)

Each of silicon carbide films shown in Table 18 is formed in the same manner as in Experiment 1. In this case, a disc-shaped substrate of silicon carbide ceramic having a diameter of 400 mm and a thickness of 30 mm is used as a substrate 15. When the film-forming temperature reaches 1430° C., hydrogen is first fed for 10 minutes, and then hydrogen and carbon tetrachloride are introduced for one minute, and thereafter silicon tetrachloride and methane are introduced. The thickness of the thus obtained silicon carbide film is 2 mm at a central portion of the disc-shaped substrate. In Examples a–k of Table 18, each volume of the starting gases supplied at the film-forming temperature is varied as shown in Table 17. The unit of each numerical value in Table 17 is litter/minute.

After the formation of the silicon carbide film, a flat film having a size of 8×8×1.5 mm is cut out from the substrate. A gold electrode is formed by sputtering gold onto the film and contacted with a platinum conductor and fixed with a silver paste. Then, a Hall effect and a resistivity are measured with respect to the film by Van-der-pauw method. In this case, a value of a current applied is 0.1–0.3 mA, and a magnetic field applied is 3.5 kG or 7 kG. The resistivity is measured within a temperature range of 300–500 K, and an activation energy is calculated from a gradient between 1000/T and a logarithm of the resistivity. Further, the carrier density ($n_e$) and the Hall mobility ($\mu_H$) are calculated according to the following equations from Hall coefficient ($R_H$) and conductivity ($\sigma$) measured by Van-der-pauw method.

$$n_e = 3\pi/(8R_H e)$$

$$\mu_H = \sigma \cdot R_H$$

in which e is an electric charge of an electron.

TABLE 17

| | Ar | $H_2$ | $SiCl_4$ | $CH_4$ | $(SiCl_4 + CH_4)/(Ar + H_2)$ |
|---|---|---|---|---|---|
| a | 7.6 | 17.5 | 6.5 | 5.0 | 0.46 |
| b | 7.6 | 17.5 | 2.6 | 2.0 | 0.18 |
| c | 7.6 | 17.5 | 6.0 | 4.6 | 0.42 |
| d | 7.6 | 17.5 | 7.8 | 6.0 | 0.55 |
| e | 7.6 | 17.5 | 9.0 | 6.8 | 0.63 |
| f | 7.6 | 17.5 | 2.0 | 1.5 | 0.14 |
| g | 15.2 | 35.0 | 1.3 | 1.0 | 0.05 |
| h | 7.6 | 17.5 | 1.3 | 1.0 | 0.09 |
| i | 20.1 | 5.0 | 5.2 | 4.0 | 0.37 |
| j | 7.6 | 17.5 | 4.0 | 4.0 | 0.32 |
| k | 0.0 | 25.1 | 5.2 | 4.0 | 0.37 |

TABLE 18

| | Carrier density (/cm$^3$) | Hall mobility (cm$^2$/V-sec.) | Activation energy (eV) | Average size of facet ($\mu$m) | Area ratio of facet ($\geq 20$ $\mu$m) (%) | Resistivity at 20° C. ($\Omega$.cm) | Aspect ratio |
|---|---|---|---|---|---|---|---|
| a | 1 × 10$^{17}$ | 1.0 | 0.161 | 4.2 | 24 | 75 | 4 |
| b | 1 × 10$^{17}$ | 0.3 | 0.157 | 4.7 | 50 | 235 | 12 |
| c | 5 × 10$^{17}$ | 1.0 | 0.158 | 5.3 | 64 | 44 | 5 |
| d | 5 × 10$^{17}$ | 1.5 | 0.162 | 5.2 | 56 | 26 | 2 |
| e | 5 × 10$^{17}$ | 1.8 | 0.162 | 7.4 | 72 | 14 | 1.3 |
| f | 5 × 10$^{16}$ | 0.4 | 0.159 | 3.8 | 28 | 450 | 17 |
| g | 1 × 10$^{15}$ | 1.0 | 0.160 | 3.1 | 8 | 6000 | 40 |
| h | 1 × 10$^{17}$ | 0.1 | 0.162 | 2.8 | 4 | 1800 | 30 |
| i | 1 × 10$^{18}$ | 0.3 | 0.166 | 5.8 | 44 | 30 | 2 |
| j | 5 × 10$^{18}$ | 1.0 | 0.162 | 5.2 | 36 | 22 | 1.5 |
| k | 5 × 10$^{19}$ | 2.0 | 0.102 | 2.8 | 24 | 0.5 | 1 |

As to the manufacturing conditions shown in Table 17, Examples a–d, i, and j are within the scope of the invention.

The CVD-SiC film according to the invention is n-type semiconductor. As seen from Table 17, the resistivity at 20° C. can be controlled to 20–500 $\Omega$·cm when the Hall mobility at 20° C. is 0.3–1.5 cm$^2$/V·sec, the carrier density is 1×10$^{16}$–1×10$^{18}$/cm$^3$, and the activation energy of carrier is 0.15–0.17 eV.

Further, each of the silicon carbide films shown in Table 18 has a microstructure diagrammatically shown in FIG. 10 when the face of the film at a section perpendicular to the substrate is observed by means of a scanning electron microscope. As seen from the results of Table 18, the resistivity at 20° C. can be controlled to 20–500 $\Omega$·cm when the average size of the facet is 4–6 μm and the area ratio of the facet having a size of not less than 20 μm to total area of the facets is 10–80%.

As mentioned above, according to the invention, there can be provided the heating apparatus for accommodating and heating the corrosive substance, which is high in the corrosion resistance against the corrosive substance and can rapidly heat the corrosive substance and is good in the heat efficiency in the heating of the corrosive substance. And also, the invention can provide the corrosion-resistant member usable for the above heating apparatus and the method manufacturing the same.

What is claimed is:

1. A corrosion-resistant member comprising a silicon carbide ceramic substrate having a resistivity at room temperature of not less than 5000 Ω·cm, and a chemical vapor deposited film consisting of silicon carbide of a thickness of not less than 1 mm directly covering at least a surface of the substrate to be exposed to a corrosive substance and having a resistivity at room temperature of 20–500 Ω·cm.

2. A corrosion-resistant member according to claim 1, wherein the silicon carbide film is an n-type semiconductor and has a Hall mobility at 20° C. of 0.3–1.5 $cm^2$/V·sec, a carrier density of $1\times10^{16}$–$1\times10^{18}$/$cm^3$, and an activation energy of carriers of 0.15–0.17 eV.

3. A corrosive-resistant member according to claim 1, wherein the silicon carbide film is an aggregate of columnar crystals having an aspect ratio of 1.5–20.

4. A corrosive-resistant member according to claim 3, wherein the columnar crystals extend in a direction substantially perpendicular to a surface of the silicon carbide film.

5. A corrosive-resistant member according to claim 3, wherein the columnar crystal includes at its tip facets of quadrilateral pyramid in the surface of the chemical vapor deposited silicon carbide film wherein an average size of the facet is 4–6 μm viewing from the surface side of the silicon carbide film, and an area ratio of the facet having a size of not less than 20 μm to total area of the facets is 10–80%.

6. A method of manufacturing a corrosion-resistant member as claimed in claim 1 by forming a silicon carbide film on a substrate through a chemical vapor deposition method, in which hydrogen is fed at a film-forming temperature, and then at least one silicon-supplying compound selected from the group consisting of $SiCl_4$, $SiHCl_3$, $SiH_2Cl_2$ and $SiH_4$ and at least one carbon-supplying compound selected from the group consisting of $CH_4$, $C_2H_6$ and $C_3H_8$ are fed.

7. A method of manufacturing a corrosion-resistant member as claimed in claim 1 by forming a silicon carbide film on a substrate through a chemical vapor deposition method, in which hydrogen is fed at a film-forming temperature, and then at least one silicon-supplying compound selected from the group consisting of $SiCl_4$, $SiHCl_3$, $SiH_2Cl_2$ and $SiH_4$ is fed and thereafter the silicon-supplying compound and at least one carbon-supplying compound selected from the group consisting of $CH_4$, $C_2H_6$ and $C_3H_8$ are fed.

8. A method of manufacturing a corrosion-resistant member as claimed in claim 1 by forming a silicon carbide film on a substrate through a chemical vapor deposition method, in which when a mixed gas of at least one silicon-supplying compound selected from the group consisting of $SiCl_4$, $SiHCl_3$, $SiH_2Cl_2$ and $SiH_4$, at least one carbon-supplying compound selected from the group consisting of $CH_4$, $C_2H_6$ and $C_3H_8$, $H_2$ and Ar is used as a starting gas, the following relations are satisfied in the starting gas:

$$0.14 \leq ([A]+[B]\times n)/([Ar]+[H_2]) \leq 0.55$$

$$1.0 \leq [A]/([B]\times n) \leq 1.6$$

$$0.09 \leq [Ar]/[H_2] \leq 5$$

wherein n is a carbon atom number per one molecule of the carbon-supplying compound, [A] is a volume of the silicon-supplying compound converted to gas at a standard state, [B] is a volume of the carbon-supplying compound converted to gas at a standard state, [Ar] is a volume of the argon converted to gas at a standard state, and [$H_2$] is a volume of the hydrogen converted to gas at a standard state.

* * * * *